United States Patent [19]

Rouy

[11] Patent Number: 5,539,694
[45] Date of Patent: Jul. 23, 1996

[54] MEMORY WITH ON-CHIP DETECTION OF BIT LINE LEAKS

[75] Inventor: Olivier Rouy, Provence, France

[73] Assignee: SGS-Thomson Microelectronics, S.A., Gentilly Cedex, France

[21] Appl. No.: 260,695

[22] Filed: Jun. 16, 1994

Related U.S. Application Data

[62] Division of Ser. No. 55,536, Apr. 28, 1993, Pat. No. 5,351, 214.

[30] Foreign Application Priority Data

Apr. 30, 1992 [FR] France .................... 92 05420

[51] Int. Cl.$^6$ ................................ G11C 7/00
[52] U.S. Cl. .................... 365/189.09; 365/189.07; 365/201; 365/210
[58] Field of Search ...................... 365/210, 201, 365/185.21, 185.33, 189.07, 189.09; 371/21.4

[56] References Cited

U.S. PATENT DOCUMENTS

| | | | |
|---|---|---|---|
| 4,800,332 | 1/1989 | Hutchins | 324/73 R |
| 4,841,482 | 6/1989 | Kreifels et al. | 365/185 |
| 5,117,394 | 5/1992 | Amin et al. | 365/203 |
| 5,142,496 | 8/1992 | Van Buskirk | 365/201 |
| 5,157,626 | 10/1992 | Watanabe | 365/185 |
| 5,218,570 | 6/1993 | Pascucci et al. | 365/189.01 |
| 5,241,505 | 8/1993 | Hashimoto | 365/210 |
| 5,371,706 | 12/1994 | Krentz et al. | 365/210 X |

FOREIGN PATENT DOCUMENTS 146975   7/1985   European Pat. Off. .

OTHER PUBLICATIONS

IBM Technical Disclosure Bulletin, vol. 33, No. 5, Oct. 1990, pp. 389-390, "Bit Line Leakage Screen for Directory Chips".

*Primary Examiner*—Do Hyun Yoo
*Attorney, Agent, or Firm*—Betty Formby; Robert Groover

[57] ABSTRACT

A circuit for the detection of current leaks on a bit line of a memory (such as an EPROM or flash EPROM), which essentially utilizes a current generator and a circuit to apply zero volts to the gates of all the cells of the bit line. The detection information is delivered by a comparison circuit. It corresponds to the result of the comparison between the test current and the current flowing in the bit line. Advantageously, the detection circuit is incorporated into the read circuit of the memory. Also disclosed is the associated detection method and a memory circuit using a detection circuit such as this.

17 Claims, 1 Drawing Sheet

MEMORY WITH ON-CHIP DETECTION OF BIT LINE LEAKS

CROSS-REFERENCE TO RELATED APPLICATION

This is a divisional application of application Ser. No. 08/055,536, filed Apr. 28, 1993, now U.S. Pat. No. 5,351,214.

This application claims priority from French Application 92-05420, filed Apr. 30, 1992, which is hereby incorporated by reference.

BACKGROUND AND SUMMARY OF THE INVENTION

The invention relates to an electronic circuit that enables the detection of abnormal current leaks on a bit line of an electrically programmable read-only memory. It also relates to the associated method and to a memory circuit comprising a detection circuit such as this.

The invention is particularly designed to improve the testing of the memories when they come off the production line. The testing of the memories requires identification of the defective elements. The information is then used to determine whether or not the memory can be repaired. The repairing consists in activating the redundant elements of the circuit to replace the defective elements.

It can be seen that it is useful to be able to identify all the defective elements, firstly because the customer should be supplied with operational circuits and, secondly, because it is necessary to be sure that the circuit delivered to the customer is reliable and will not go out of order before its lifetime as guaranteed by the manufacturer.

Now, concerning more especially the bit lines of the electrically programmable read-only memories, it is possible that excessive current leaks on the bit lines may create difficulties.

It is recalled that the cells of such memories are organized in rows and columns, the cells of one and the same row having their gates connected together to a word line, and the cells of one and the same column having their drains connected to a bit line. All the sources of a same memory sector are connected together.

A word line decoder can be used to address a particular word line and to apply determined potentials depending on the mode of operation.

A bit line decoder can be used to select a particular bit line to connect it to a determined circuit element depending on the mode of operation.

A memory cell is addressed by the selection of a bit line and a word line.

In reading mode, the selection of a word line consists in taking this line to a reading potential of 5 volts for example. All the other word lines are taken to zero volts.

In reading mode, the selection of a bit line results in its connection to a reading amplifier by a current/voltage converter which delivers a voltage that corresponds to the current of the bit line.

The cell addressed in reading mode consumes or does not consume current on the bit line, depending on whether its state is blank or programmed. A corresponding potential is set up at output of the current/voltage converter. The reading is then done by comparison, in the reading amplifier of this potential, with that given by a reference circuit connected to a blank cell, the principle being that a blank cell is conductive at 5 volts and that a programmed cell is not conductive (or shows low conductivity).[1]

[1]See, e.g., the following U.S. Pat. Nos., all of which are hereby incorporated by reference: 5,132,576, Sense amplifier having load device providing improved access time; 5,109,187, CMOS voltage reference; 4,965,473, Eprom low voltage sense amplifier; 4,908,795, Semiconductor integrated circuit device with built-in memories; 4,903,237, Differential sense amplifier circuit for high speed ROMS, and flash memory devices; 4,813,018, Nonvolatile semiconductor memory device; 4,807,188, Nonvolatile memory device with a high number of cycle programming endurance; 4,785,423, Current limited epld array; 4,783,764. Semiconductor integrated circuit device with built-in memories, and peripheral circuit which may be statically or dynamically operated; 4,775,958, Semiconductor memory system. These materials not only provide some indication of alternative approaches to sensing, but also provide some examples of the variety of integrated circuit contexts in which the innovation sense amplifier can be used.

In practice, if the potential is lower than that of the reference circuit, i.e. if the cell addressed consumes current, then the cell of the bit line is blank or erased. If it is greater, i.e. if the addressed cell consumes no current, then the cell is programmed. Now, if there are major current leaks on the bit line, it might be thought that the addressed cell is erased, whereas it will actually be programmed: the current leaks mask the real state of the cell.

These current leaks may be leaks at certain source-substrate junctions of the cells, due to a manufacturing defect. They may also come from an excessively depleted cell, a gate voltage at 0 volts being sufficient to turn on such a cell.[2] If a nonconducting cell is addressed on such a bit line, its programmed state may be masked by the erased state of an excessively depleted cell located on the same bit line.

[2]This problem of depleted cells is encountered in electrically erasable memories. In these memories, an erasure voltage that is too high, and/or is applied for too long, will discharge the floating gate to an excessive degree and will deplete the cell.

In the invention, there is proposed an approach that does not modify the structure of the memory map. In the invention, it is desired to detect the defect in order to correct it if possible.

Hence, there is proposed a circuit for the detection of current leaks on the bit lines of a memory, said circuit being usable in tests in order to identify the bit lines having such a defect, in order to then repair them when this is possible.

The circuit for the detection of current leaks is an electronic circuit which enables the comparison of the current flowing through each of the bit lines of the memory map with a test current, when all the word lines are taken to zero volts. Indeed, under these conditions, the cells should not be conductive, for their conduction threshold is typically 2 to 2.5 volts for a blank cell and at least five volts for a programmed cell. However, if a cell is depleted, i.e. if its conduction threshold is negative or zero, or if there is a junction leak, a current is conducted by the bitline. This leakage current is compared with the test current. If this leakage current is greater than the test current, then the bit line could be filed as being defective.

The invention therefore relates to a circuit for the detection of leakage currents in a bit line of an electrically programmable read-only memory.

This circuit comprises chiefly a current generator and a control circuit for the application, in detection mode, of a control voltage to the current generator and for the activation of the ground connection of the gates of the cells of a bit line. A comparison circuit is used to detect a leakage current on a bit line greater than the current delivered by the current generator.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

Figure 1:
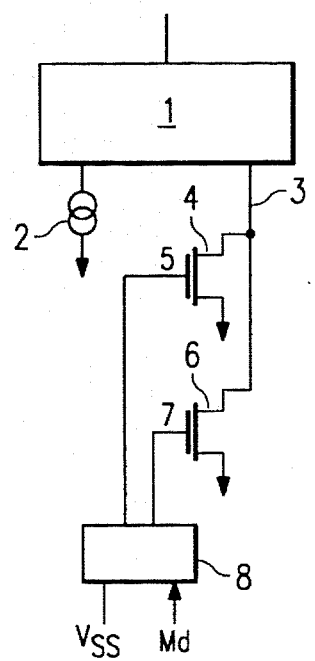
FIG. 1 is a diagram showing the principle of the invention.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

A comparison circuit 1 is connected at input, firstly to a current generator 2 and, secondly, to a bit line 3. The current generator 2 delivers a test current. The bit line 3 comprises two memory cells 4 and 6. In the invention, the memory cells 4, 6 have their gates 5, 7 controlled by a control circuit 8 which connects these gates to the ground on receiving a detection mode signal Md.

The principle of detection is as follows: the conduction threshold of a blank or erased cell is of the order of 2.5 volts and the conduction threshold of programmed cells is at least 5 volts in one example. Hence, with 0 volts being applied to their gates in detection mode, the cells 4 and 6 will not be conductive, irrespective of whether they are programmed or blank, since the voltage that is applied to them is below the conduction thresholds.

However, let it be assumed for example that the cell 4 is abnormally depleted. This means that its conduction threshold is negative or zero: the cell 4 will therefore become conductive with a gate voltage of zero, and there will be a current on the bit line 3.

The comparison circuit compares this current with the test current delivered by the current generator 2. If the current of the bit line is greater, there is a troublesome leakage of current and the output of the comparison circuit delivers an information element on malfunctioning. The test current may range, for example, from 10 to 50 microamperes. (In normal applications, the test current is typically 10–15 µA. In future designs, it would be desirable to tighten this parameter to less than 10 µA.)

The general principle of the invention, therefore, consists of the detection of a current leak on a bit line by the comparison of the current delivered by this bit line with the test current delivered by a current generator, when all the cells of the bit line have their gate at zero volts.

It is thus possible to detect excessive leakage currents which will hamper the normal operation of the memory circuit. In the example of a depleted cell 4, the existence of a current leak will be detected on the bit line 3, and the bit line 3 will be filed as a defective element of the memory. If, instead of a depleted cell, there is a source/substrate junction leak on a bit line, there will also be a leakage current on the bit line 3. If this current is greater than the test current that had been fixed by the current generator, then the bit line 3 will be detected as undergoing an excessive leakage of current and this bit line will be filed as being a defective element.

If necessary, the test current delivered by the current generator may have a different value depending on the desired class of reliability or endurance (number of read/write cycles).

Figure 2:
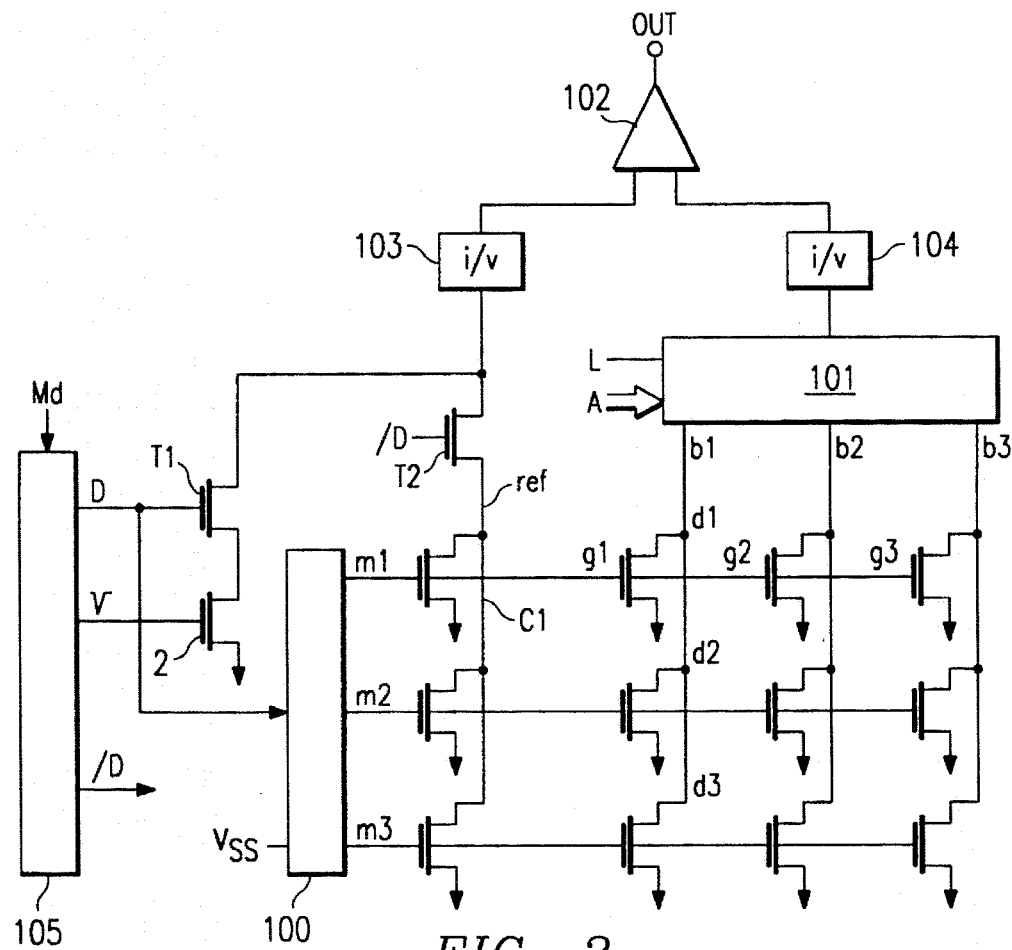
FIG. 2 shows a preferred embodiment of the principle of the invention.

FIG. 2 shows an embodiment of the principle of the invention in a sample memory circuit embodiment. The three bit lines b1, b2, b3, and three word lines m1, m2, m3, schematically represent a memory array. The drains d1, d2, d3 of the cells of a particular bit line b1 are all connected to this bit line. The gates g1, g2, g3 of the cells of a particular word line m1 are all connected to this word line. The word lines are controlled by a decoder 100 of word lines. The bit lines are controlled by a decoder 101 of bit lines.

The detection circuit comprises a comparison circuit, a control means and a current generator.

The comparison circuit preferably comprises a comparator 102, a current/voltage converter 103, the input of which is connected to the current generator 2 and the output of which is connected to the comparator, and another current/voltage converter 104, the input of which is connected in detection mode to a selected bit line and the output of which is connected to the comparator.

The control means 105 receives a detection mode command Md from the exterior and delivers a detection signal D, an inverted detection signal /D and a control potential $\underline{V}$ for the current generator 2. In the example of FIG. 2, this current generator is a transistor with its drain connected to the current/voltage converter 103 of the detection circuit, the source of which is connected to the ground and the gate of which is controlled by the control potential V. Preferably, the transistor which forms the current generator 2 is a highly resistive transistor which will therefore let through a weak current. (In a sample embodiment, this transistor has drawn W/L of 5/20µin 0.8 µm geometries.) Other embodiments of the current generator may be envisaged, for example by using a memory cell.

In a sample embodiment (for a 1M flash EEPROM), a typical value for the current passed by the current generator 2 during test mode would be 10 µA. (For comparison, in this same embodiment, the current passed by the reference column ref during a normal read operation (with one row mx selected) would be 100 µA.

The word line decoder 100 receives the detection signal D and the ground reference Vss.

The operation then is as follows: upon the activation of a detection mode signal Md, the control means 105 activate the detection signal D and give the control potential V at the gate of the transistor forming the current generator 2. This current potential may be variable. It may be controlled from the exterior or set internally in the circuit.

Upon activation of the detection signal D, the word line decoder 100 connects all its word lines to the ground Vss. Each bit line is then addressed in detection mode, one after the other. This can be done by an internal sequencer activated by the control means 105 or by an external testing set which presents the addresses A successively to the bit line decoder 101. When a bit line is addressed in detection mode, the bit line decoder connects the bit line to an input of the comparator 102 by the current/voltage decoder 104 of the detection circuit. The current/voltage converter 103 associated with the current generator 2 of the detection circuit is connected with the other input of the comparator. At the output OUT, the comparator delivers the result of the comparison between the two values of voltage corresponding to the current that flows in the bit line and corresponding to the test current delivered by the current generator. The output information is, for example, used by a circuit (not shown) which files all the defective elements.

It is then possible to select the next bit line, and thus all the bit lines of the memory sector associated with the reading amplifier are inspected in turn.

In this way, all the fields of the memory are tested and, at the end of the procedure, a tester may examine all the defective elements and determine whether there is a possibility of repairs for each defective bit line.

Preferably, the control means 105 of the detection circuit give a control potential V of the current generator which may vary. Thus, depending on the destination of the circuit, the test current used may be varied according to the requirements of the target application (e.g. for applications which require an extended operating temperature range, very high reliability, and/or very-low-power consumption).

In general, a memory field such as the one described comprises a reading circuit that includes a blank reference cell for each of the word lines. The reference cells are placed on a reference bit line marked ref in FIG. 2. The gate of a reference cell is connected to the corresponding word line, and there is thus one reference cell per word line in the memory field. In reading mode, the bit line of a selected cell is connected by the decoder 101 of bit lines to a reading amplifier of the memory field considered by a current/voltage converter. The reference bit line ref is connected to the reading amplifier by a current/voltage converter. The reading amplifier compares the voltage values that correspond to the current conducted by the selected cell and to the current controlled by the associated blank reference cell to which there is applied the same gate voltage as that of the selected cell (they are on the same word line).

In the invention, there is provision for incorporating the detection circuit in a reading circuit such as this. To this end, it is proposed advantageously to introduce a first switch-over transistor T1 in series between the current/voltage converter 103 and the current generator 2 of the detection circuit, and a second switch-over transistor T2 in series between this same current/voltage converter 103 and the bit line ref of the reference cells. The first switch-over transistor T1 is controlled at its gate by the detection signal D delivered by the control means 105. The second switching transistor T2 is controlled at its gate by the inverted detection signal/D. The comparator 102 of the reading circuit is advantageously the reading amplifier of the memory field considered. Finally, one and the same current/voltage converter 104 is used in reading mode and in detection mode by the bit line decoder 101 to connect a bit line to the reading amplifier 102, upon reception by the decoder 101 of a control signal L activated by the control means 105 of the detection circuit or by a means (not shown) associated with the reading circuit.

Thus, by incorporating the detection circuit into the reading circuit, a single comparison circuit is used for two different functions, and a switch-over will be made from one function to the other, depending on the mode of operation of the memory: reading mode or detection mode.

Thus, by means of a relatively simplified electronic circuitry, it will become possible to carry out a reliable and complete detection that is done in a simple way and makes it possible to determine those bit lines that are conducting excessive leakage currents. The advantageous incorporation of this detection circuit into a reading circuit of the memory is relatively easy and does not necessitate many modifications as has been seen. Significant advantages are obtained for testing and repairing the memory circuits.

Figure 3:
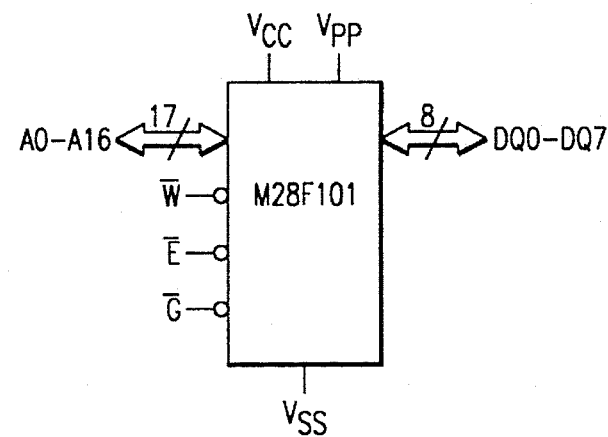
FIG. 3 is a logic diagram of a sample implementation of the disclosed innovations in a 1M flash-EEPROM.

FIG. 3 is a logic diagram of a sample implementation of the disclosed innovations in a 1M flash-EEPROM. However, of course, this is merely illustrative, and the claimed innovations can be employed in a wide variety of integrated circuit memories.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, in a chip which includes multiple subarrays, the testing of subarrays will depend to some extent on the decoding architecture. In some such implementations, all subarrays can optionally be tested in parallel.

In view of the problem of excessively depleted cells in EEPROMs (as discussed above), a "rolling row" scheme,- where exhausted rows of EEPROM cells are disabled in-service (and replaced by previously idle rows), has been proposed. Although the primary contemplated use of the presently preferred embodiment is for back-end or front-end testing, the testing circuit of the disclosed innovations can also (alternatively and less preferably) be used, in combination with such a rolling-row replacement architecture, for in-service testing of EEPROMs or flash EEPROMs.

In a further class of alternative embodiments, the testing circuit of the disclosed innovations can also (alternatively and less preferably) be used for leakage testing of SRAMs.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A circuit for detection of leakage currents on a bit line of an electrically programmable read-only memory which is composed of cells organized in rows and columns, each cell having a source, gate and drain, wherein the drains of all said cells in each column are connected to a respective bit line; said circuit comprising:

a current generator;

a control circuit for the application, in detection mode, of a control voltage to said current generator and for ground connection of said gate of each said cell in a selected bit line; and a comparison circuit connected, firstly, to said selected bit line and, secondly, to said current generator to detect a leakage current on said selected bit line greater than the current delivered by said current generator;

wherein said comparison circuit comprises a comparator, a first current/voltage converter, the input of said first current/voltage converter being connected to said current generator and the output of said first current/voltage converter being connected to said comparator, and a second current/voltage converter, the input of said second current/voltage converter being connected in detection mode to said selected bit line and the output of said second current/voltage converter being connected to said comparator.

2. A detection circuit according to claim 1, further comprising:

a reference circuit with at least one reference cell connected to the input of said first current/voltage converter;

a first switch-over transistor controlled, at its gate, by a detection signal and placed in series between said first converter and said current generator; and a second switch-over transistor controlled at its gate by a signal which is complementary to said detection signal and placed in series between said first converter and said reference circuit.

3. A detection circuit according to claim 1, the gates of said cells of a same row being connected together to a respective word line, wherein a decoder of said word lines receives a detection signal of said control circuit and wherein, when said detection signal is active, said word line decoder connects all said word lines to ground.

4. A detection circuit according to claim 1, wherein said control voltage delivered by said control circuit is variable.

5. A chip comprising a detection circuit according to claim 1, wherein said detection circuit detects defective bit lines and outputs corresponding location data.

6. A chip, comprising:

a non-volatile memory composed of cells organized in rows and columns, wherein the drains of all said cells in each column are connected to a respective bit line and wherein the gates of all said cells in each row are connected to a respective word line;

a current generator;

a control circuit;

a comparator;

a first current/voltage converter, the input of said first current/voltage converter being connected in detection mode to said current generator and the output of said first current/voltage converter being connected to said comparator; and a second current/voltage converter, the input of said second current/voltage converter being connected in detection mode to a selected bit line and the output of said second current/voltage converter being connected to said comparator;

wherein, in detection mode, said control circuit supplies a control voltage to said current generator and connects the gates of said cells in said selected bit line to ground; and wherein, in detection mode, said comparator is connected to compare the output of said current generator with the current on said selected bit line to detect a current leakage on said selected bit line.

7. The chip of claim 6, further comprising:

a reference circuit with at least one reference cell connected to the input of said first current/voltage converter;

a switch to selectably connect said first current/voltage converter to either said reference circuit or said current generator;

wherein in read mode, said switch connects said first current/voltage converter to said reference circuit; and wherein in detect mode, said switch connects said first current/voltage converter to said current generator.

8. The chip of claim 7, wherein the current passed by said current generator during detect mode is less than one-fourth of the current passed by said reference circuit during read mode.

9. A detection circuit comprising:

a non-volatile memory composed of cells organized in rows and columns, wherein the drains of all said cells in each column are connected to a respective bit line and wherein the gates of all said cells in each row are connected to a respective word line;

a current generator;

a control circuit; and a comparison circuit, a first input of said comparison circuit being connected to the output of said current generator;

wherein, in detection mode, said control circuit supplies a control voltage to said current generator and connects the gates of said cells in a selected bit line to ground; and wherein, in detection mode, said comparison circuit is connected to compare the output of said current generator with the current on said selected bit line to detect a current leakage on said selected bit line;

wherein said comparison circuit comprises a comparator, a first current/voltage converter, the input of said first current/voltage converter being connected to said current generator and the output of said first current/voltage converter being connected to said comparator, and a second current/voltage converter, the input of said second current/voltage converter being connected in detection mode to said selected bit line and the output of said second current/voltage converter being connected to said comparator.

10. The detection circuit of claim 9, wherein said non-volatile memory is a flash-EEPROM.

11. The detection circuit of claim 9, wherein said current generator is a weak transistor.

12. The detection circuit of claim 11, wherein said weak transistor has a length greater than two times its width.

13. The detection circuit of claim 9, wherein the output of said current generator in detection mode is in the range of 10–15 µA.

14. The detection circuit of claim 9, further comprising:

a reference circuit with at least one reference cell connected to the input of said first current/voltage converter.

15. The detection circuit of claim 9, further comprising:

a reference circuit with at least one reference cell connected to the input of said first current/voltage converter;

a switch to selectably connect said first current/voltage converter to either said reference circuit or said current generator;

wherein in read mode, said switch connects said first current/voltage converter to said reference circuit; and wherein in detect mode, said switch connects said first current/voltage converter to said current generator.

16. The detection circuit of claim 15, wherein the current passed by said current generator during detect mode is less than one-fourth of the current passed by said reference circuit during read mode.

17. The detection circuit of claim 15, wherein the current passed by said current generator during detect mode is approximately 10 µA and the current passed by said reference circuit during read mode is approximately 100 µA.

* * * * *